US011336197B2

(12) United States Patent
Kurokawa et al.

(10) Patent No.: US 11,336,197 B2
(45) Date of Patent: May 17, 2022

(54) POWER CONVERSION DEVICE

(71) Applicant: KEIHIN CORPORATION, Tokyo (JP)

(72) Inventors: Kazunari Kurokawa, Oyama (JP); Yuzuru Takashima, Utsunomiya (JP); Kenichi Takebayashi, Utsunomiya (JP); Kenichi Nonaka, Tokyo (JP)

(73) Assignee: HITACHI ASTEMO, LTD., Hitachinaka (JP)

(*) Notice: Subject to any disclaimer, the term of this patent is extended or adjusted under 35 U.S.C. 154(b) by 0 days.

(21) Appl. No.: 17/022,758

(22) Filed: Sep. 16, 2020

(65) Prior Publication Data
US 2021/0091651 A1    Mar. 25, 2021

(30) Foreign Application Priority Data
Sep. 24, 2019    (JP) .............................. JP2019-172850

(51) Int. Cl.
*H02M 7/00*    (2006.01)
*H02M 1/00*    (2006.01)

(52) U.S. Cl.
CPC .......... *H02M 7/003* (2013.01); *H02M 1/0009* (2021.05)

(58) Field of Classification Search
CPC .............................. H02M 7/003; H02M 1/009
See application file for complete search history.

(56) References Cited

U.S. PATENT DOCUMENTS

2010/0219785 A1* 9/2010 Hirose ............. H01L 29/66348
318/519

FOREIGN PATENT DOCUMENTS

| JP | 2004343820 A | | 12/2004 |
|---|---|---|---|
| JP | 2006121834 A | | 5/2006 |
| JP | 2007336793 A | | 12/2007 |
| JP | 2009005462 A | | 1/2009 |
| JP | 2017060255 A | * | 3/2017 |
| JP | 2017060255 A | | 3/2017 |

OTHER PUBLICATIONS

JPO Rejection Notice for corresponding JP Application No. 2019-172850; dated Jul. 7, 2020.
JPO Notice of Reasons for Rejection for corresponding JP Application No. 2019-172850: dated Nov. 24, 2020.

\* cited by examiner

*Primary Examiner* — Jue Zhang
(74) *Attorney, Agent, or Firm* — Cantor Colburn LLP

(57) ABSTRACT

This power conversion device includes a power module that has a plurality of power devices, and a circuit board that is connected to the power module, in which the circuit board has a drive circuit arrangement area in which a plurality of drive circuits for driving the plurality of power devices are disposed and a control circuit arrangement area in which a control circuit for controlling the drive circuit is disposed, and two drive circuit arrangement areas are provided with the control circuit arrangement area interposed therebetween.

8 Claims, 3 Drawing Sheets

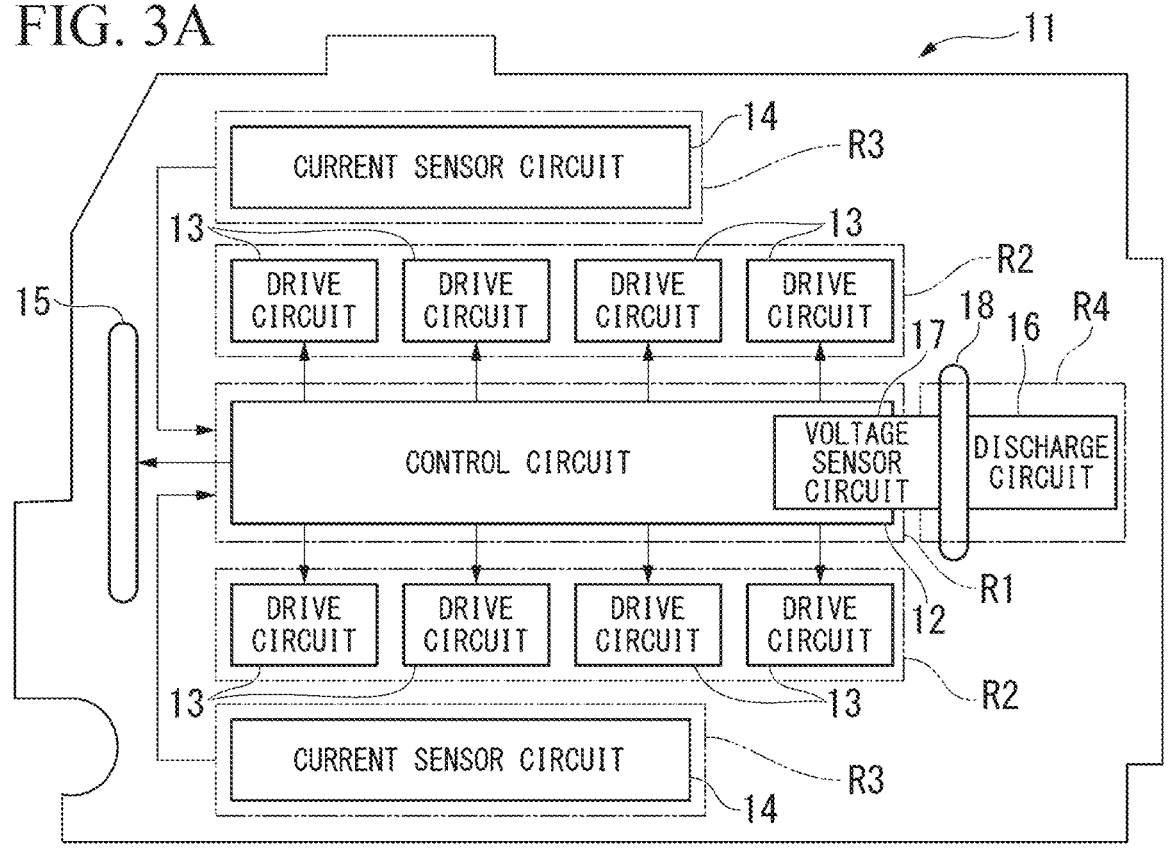
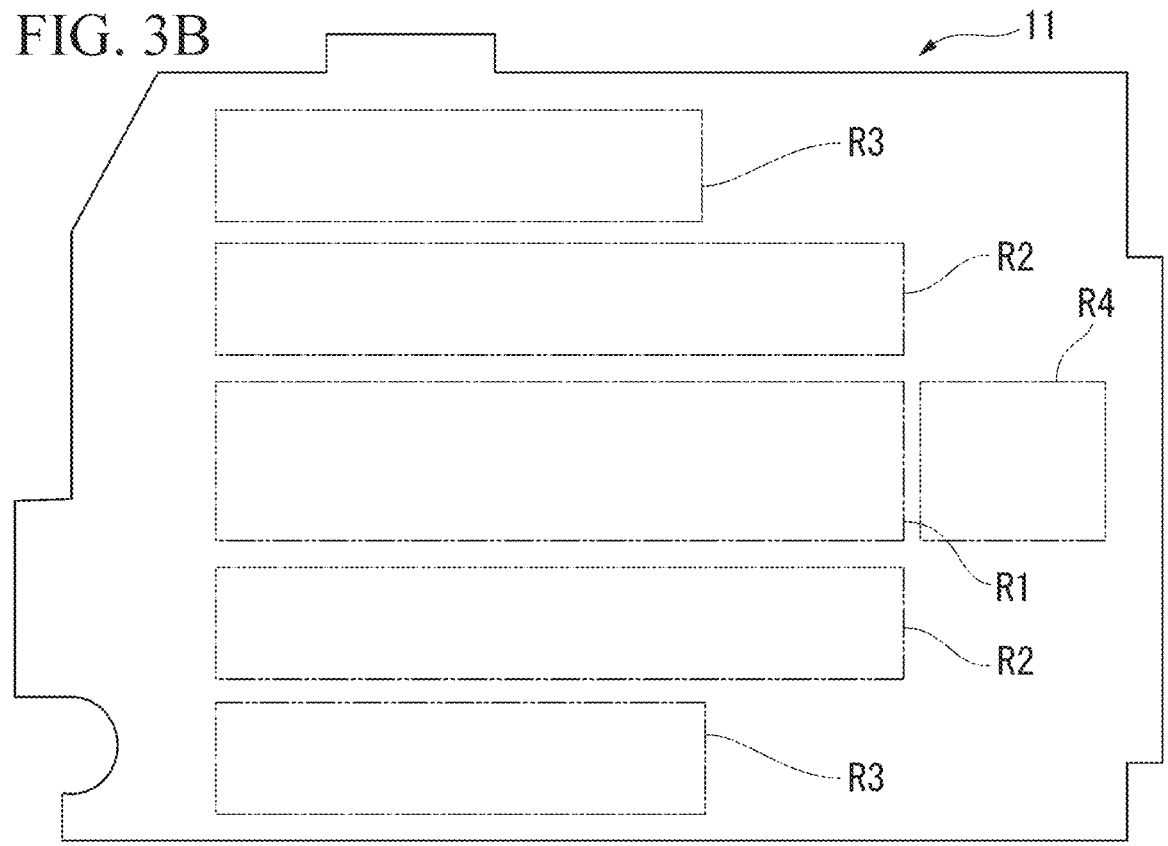

POWER CONVERSION DEVICE

CROSS REFERENCE TO RELATED APPLICATIONS

The present invention claims priority under 35 U.S.C. § 119 to Japanese Patent Application No. 2019-172850, filed Sep. 24, 2019, the entire content of which is incorporated herein by reference.

BACKGROUND OF THE INVENTION

Description of Related Art

For example, as disclosed in Japanese Unexamined Patent Application, First Publication No. 2007-336793, a power conversion device (power control unit (PCU)) is provided between a battery and a motor in a vehicle such as an electric vehicle. Such a power conversion device includes a power module having a plurality of power devices (power semiconductor chips), a circuit board on which drive circuits for driving these power devices are mounted, and the like.

SUMMARY OF THE INVENTION

Incidentally, in recent years, it has been proposed to mount a control circuit for controlling the drive circuits on the circuit board described above. The control circuit and the drive circuits can be provided on one board by mounting such a control circuit on the circuit board. For this reason, it is not necessary to connect the control circuit and the drive circuits using a wire harness, and it is possible to realize reduction in communication noise between the control circuit and the drive circuits and a decrease in size of a power conversion device.

Incidentally, the power conversion device includes a plurality of power devices as described above. For this reason, the plurality of drive circuits are provided on the circuit board. There are naturally communication delays between the control circuit and each of the drive circuits. It is necessary to manage these communication delays in control. For example, when one power device forms an upper arm of one arm of an inverter circuit, and another power device forms a lower arm of the same arm, it is necessary to reliably prevent the occurrence of a shoot-through current in which a current passes through both the upper arm and the lower arm. Therefore, it is very important to manage the communication delays in these power devices.

The present invention has been made in view of the problems described above, and aims to achieve a decrease in size of a power conversion device by disposing the control circuit and the drive circuits close to each other, and facilitating the management of communication delays between the control circuit and the drive circuits.

The present invention has adopted the following aspects for solving the problems described above.

A first aspect includes a power module that has a plurality of power devices, and a circuit board that is connected to the power module, and a first aspect adopts a configuration in which the circuit board has a drive circuit arrangement area in which a plurality of drive circuits for driving the plurality of power devices are disposed and a control circuit arrangement area in which a control circuit for controlling the drive circuit is disposed, and two drive circuit arrangement areas are provided with the control circuit arrangement area interposed therebetween.

A second aspect adopts a configuration in which the circuit board has a current detection circuit arrangement area in which a current detection circuit for detecting an input or output current to or from the power module is disposed outside the drive circuit arrangement area when viewed from the control circuit arrangement area in the first aspect.

A third aspect adopts a configuration in which the current detection circuit arrangement area is provided outside each of the drive circuit arrangement areas in the second aspect.

A fourth aspect adopts a configuration in which the circuit board has a high voltage circuit arrangement area in which a high voltage circuit handling a higher voltage than the control circuit, the high voltage circuit arrangement area being disposed in a direction orthogonal to an arrangement direction of the control circuit arrangement area and two of the drive circuit arrangement areas for the control circuit arrangement area in any one of the first to third aspects.

A fifth aspect includes a smoothing capacitor and adopts a configuration in which the high voltage circuit is a discharge circuit that discharges electric charges stored in the smoothing capacitor, and the circuit board includes a voltage detection circuit that detects an input voltage to the high voltage circuit and is connected to the control circuit in the fourth aspect.

A sixth aspect adopts a configuration in which the high voltage circuit arrangement area is disposed in a direction orthogonal to an arrangement direction of the control circuit arrangement area and two of the drive circuit arrangement areas for the control circuit arrangement area, and the circuit board is disposed on a side opposite to the high voltage circuit arrangement area when viewed from the control circuit arrangement area and includes an external interface that connects the control circuit and the outside in the fourth or fifth aspect.

According to each of the aspects of the present invention described above, in the control circuit, two drive circuit arrangement areas are provided to have the control circuit arrangement area interposed from both sides. For this reason, wiring lengths from the control circuit to each of the drive circuits can be equalized as compared to a case in which the drive circuits are irregularly disposed on the circuit board or a case in which the plurality of drive circuits are collectively disposed in one area. As a result, communication delay time between the control circuit to each of the drive circuits is equalized and management of communication delays between the control circuit and the drive circuits is facilitated. According to each of the aspects of the present invention described above, the control circuit and the drive circuit are mounted on a single board. For this reason, the power conversion device can be made small in size. Furthermore, wiring lengths from the control circuit to the drive circuit are equalized. For this reason, management of communication delays between the control circuit and the drive circuit is facilitated.

BRIEF DESCRIPTION OF THE DRAWINGS

FIG. 3A is a schematic diagram of a circuit board included in a power conversion device according to a second embodiment of the present invention, and is a schematic diagram which shows a layout of functional constituents included in the circuit board.

FIG. 3B is a schematic diagram of the circuit board included in the power conversion device according to the second embodiment of the present invention, and is a schematic diagram in which only an arrangement area shown in FIG. 3A is extracted.

DETAILED DESCRIPTION OF THE INVENTION

Hereinafter, an embodiment of a power conversion device according to the present invention will be described with reference to the drawings.

First Embodiment

Figure 1:
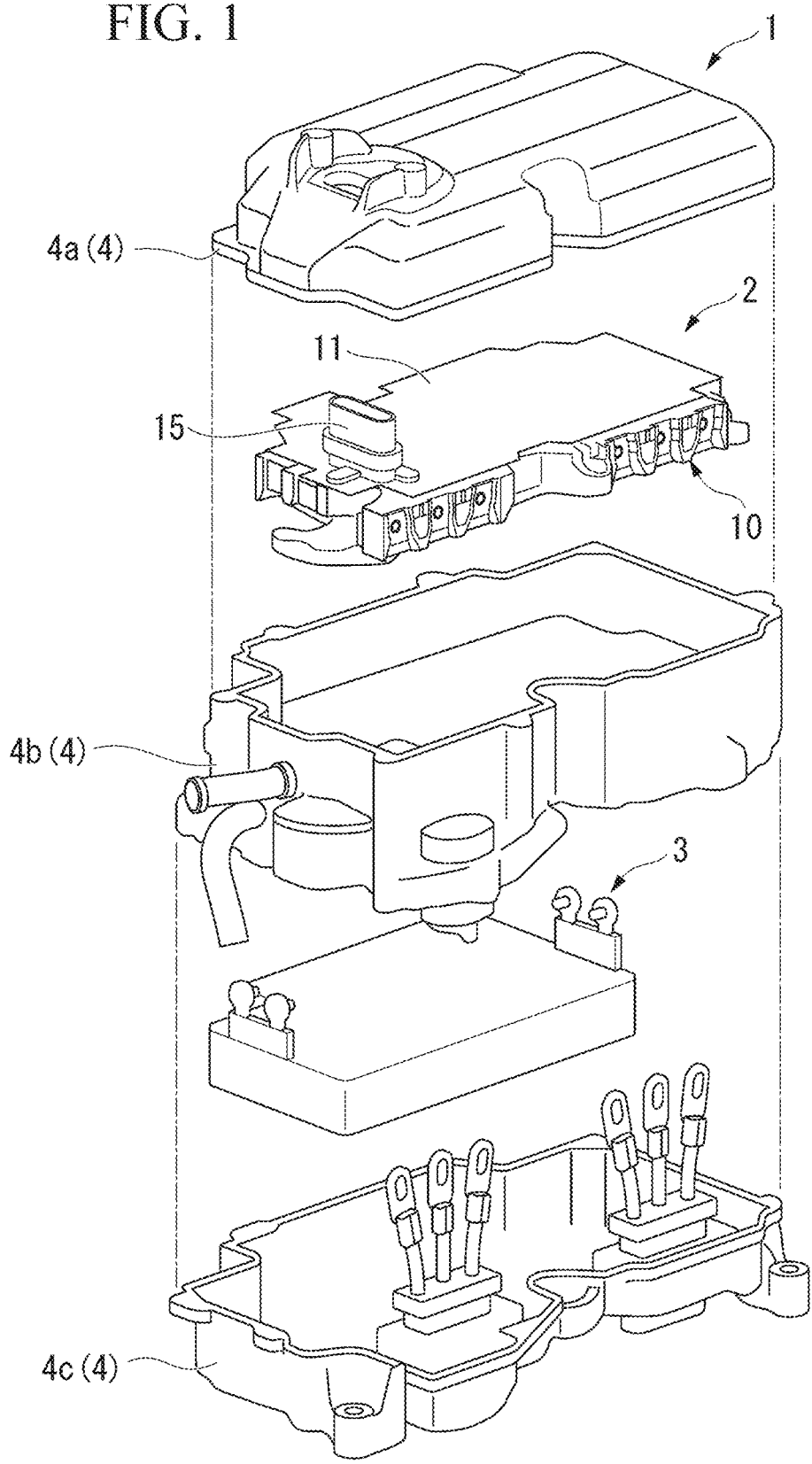
FIG. 1 is an exploded perspective view which shows a schematic configuration of a power conversion device according to a first embodiment of the present invention.

FIG. 1 is an exploded perspective view which shows a schematic configuration of a power conversion device 1 according to the present embodiment. The power conversion device 1 of the present embodiment is mounted in a vehicle such as an electric vehicle and is provided between a motor (load) (not shown) and a battery. The power conversion device 1 of the present embodiment as described above includes an intelligent power module 2, a capacitor 3, and a main body case 4 as shown in FIG. 1.

The intelligent power module 2 includes a power module 10, a circuit board 11, and a current sensor, a voltage sensor, and the like which are not shown. The power module 10 includes a plurality of power devices (not shown) which have power semiconductor elements, a power module case which holds these power devices, a bus bar connected to the power devices, a water jacket for cooling, and the like. The circuit board 11 is stacked on the power module 10. The circuit board 11 includes a plurality of drive circuits that drive the power devices, and a control circuit for controlling these drive circuits, as described below. The current sensor (not shown) is a sensor that detects a current flowing through the bus bar, and is held in, for example, the power module case. In addition, the voltage sensor (not shown) is a sensor that detects a voltage applied to the bus bar, and is held in, for example, the power module case.

The capacitor 3 is connected to the intelligent power module 2, and is disposed on a side opposite to the circuit board 11 with the power module 10 interposed therebetween. The main body case 4 is a case that houses the intelligent power module 2 and the capacitor 3, and includes an upper case 4a, a central case 4b, and a lower case 4c. The upper case 4a, the central case 4b, and the lower case 4c are connected to each other to be divided in a stacking direction of the power module 10 and the circuit board 11. The upper case 4a covers the intelligent power module 2 from the circuit board 11 side, and is fastened to the central case 4b. The central case 4b has a reactor installed therein and covers a periphery of the intelligent power module 2. The lower case 4c has a connector for connecting the intelligent power module 2 and the motor, and is fastened to the central case 4b.

This power conversion device 1 includes a pressure raising and lowering circuit configured by a power device, a capacitor 3, a reactor, and the like, and an inverter circuit. The power conversion device 1 converts power supplied from the battery into three-phase alternating current power and supplies the converted power to the motor, or sends back regenerative power from the motor to the battery.

Figure 2A:
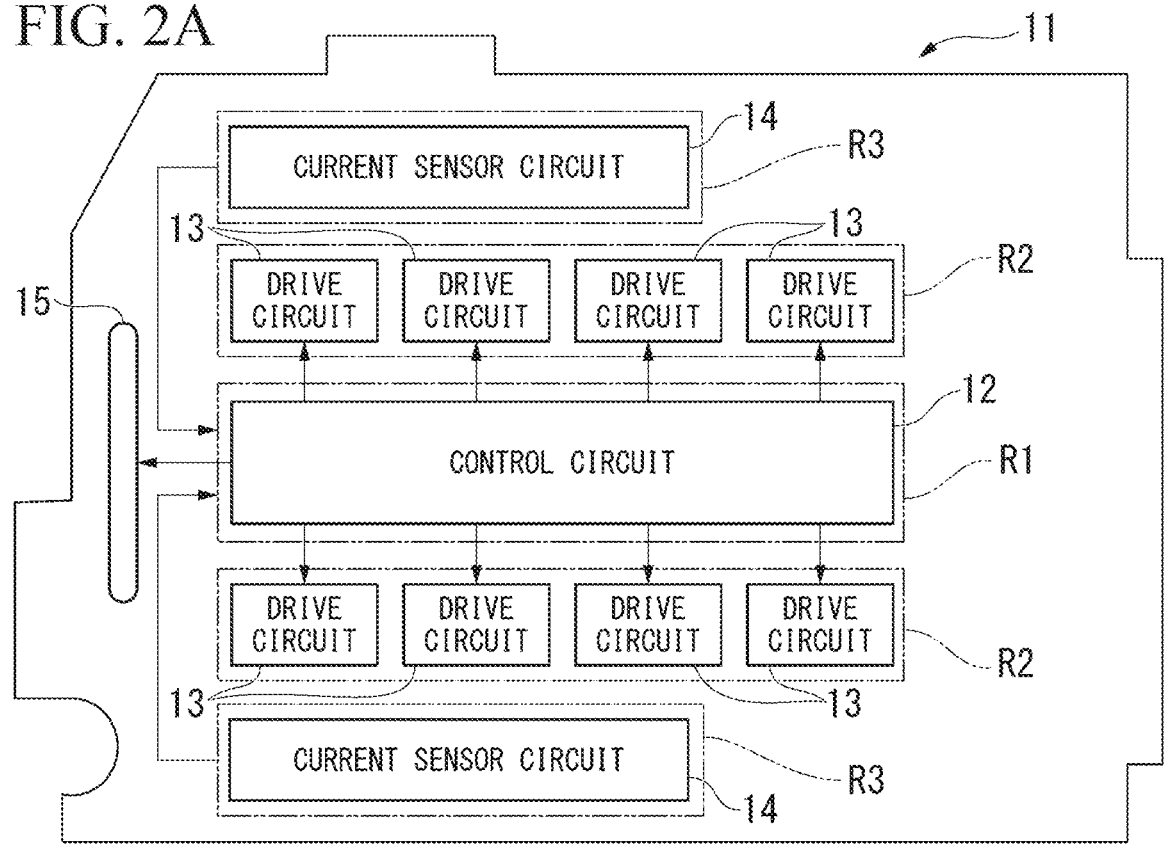
FIG. 2A is a schematic diagram of a circuit board included in the power conversion device according to the first embodiment of the present invention, and is a schematic diagram which shows a layout of functional constituents included in the circuit board.
Figure 2B:
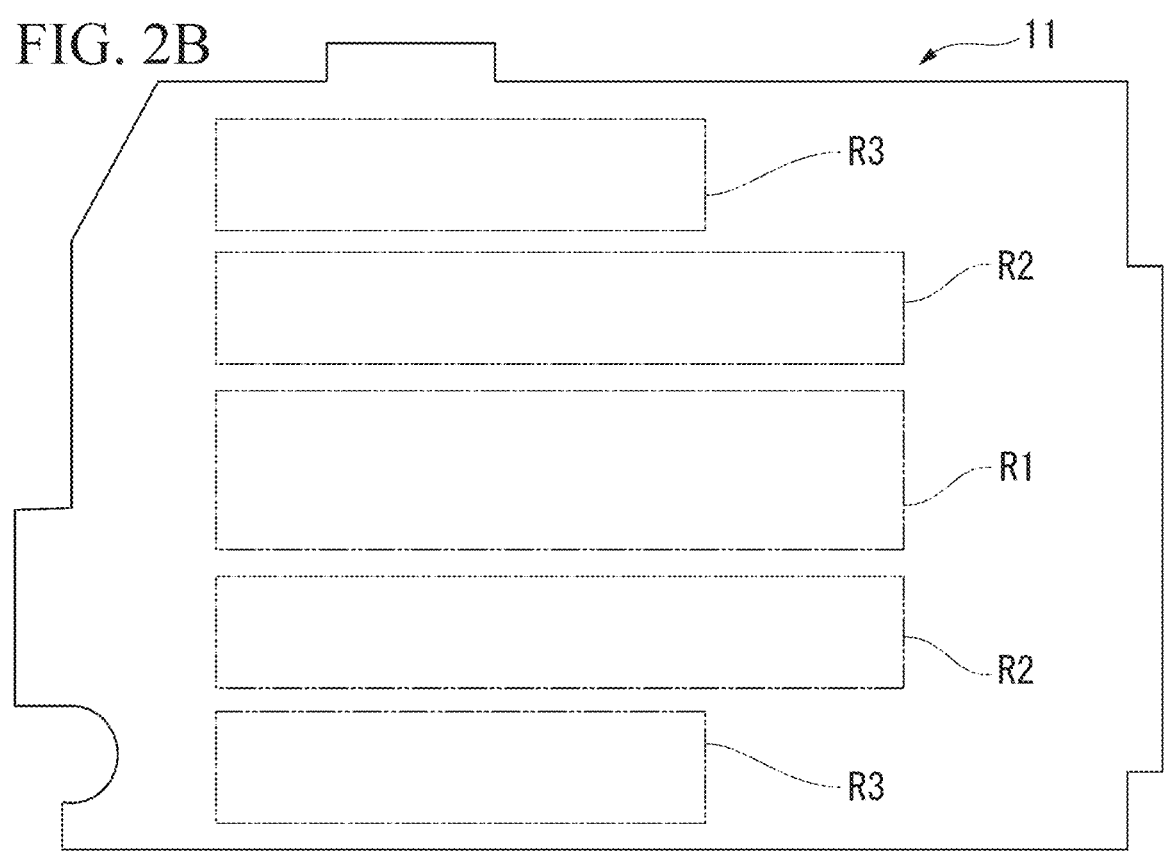
FIG. 2B is a schematic diagram of the circuit board included in the power conversion device according to the first embodiment of the present invention, and is a schematic diagram in which only an arrangement area shown in FIG. 2A is extracted.

FIG. 2A is a schematic diagram of the circuit board 11, and is a schematic diagram which shows a layout of functional constituents included in the circuit board. FIG. 2B is a schematic diagram of the circuit board 11, and is a schematic diagram in which only an arrangement area shown in FIG. 2A is extracted. The circuit board 11 of the present embodiment is a drive circuit for controlling the pressure raising and lowering circuit that raises and lowers a voltage, a drive circuit for controlling an inverter circuit that converts electric power into direct current power and three-phase alternating current, or an electronic board on which a control circuit for controlling these drive circuits is formed.

This circuit board 11 includes a single control circuit 12, a plurality of drive circuits 13, a current sensor circuit 14 (current detection circuit), and an external connector 15 as shown in FIG. 2A.

The control circuit 12 is a circuit that controls the drive circuit 13 on the basis of an input signal from the outside, and includes, for example, a one-chip microcomputer, and the like. The drive circuit 13 is a circuit for driving the power devices provided in the power module 10. For example, when the power module includes a power device that forms a switching element of an inverter and a power device that forms a switching element of a pressure raising circuit, the same number of the drive circuits 13 as the number of these switching elements are provided. Each of these drive circuits 13 is connected to the control circuit 12 in the circuit board 11, and controls, for example, on or off of the power device under control of the control circuit 12.

The current sensor circuit 14 is a circuit for detecting an input or output current to or from the power module 10. The current sensor circuit 14 generates, for example, a signal indicating a current value input to the control circuit 12 based on a signal input from a current sensor formed of a core held in a power module case and a Hall element mounted on the circuit board 11. Note that, plural current sensors are disposed at a position apart from each other in the power module case, and two current sensor circuits 14 are provided in the circuit board 11 in the present embodiment. These current sensor circuits 14 are connected to the control circuit 12 in the circuit board 11 to avoid an area in which the drive circuit 13 is disposed.

The external connector 15 (external interface) is an interface that connects the control circuit 12 and the outside, and is disposed near an end of the circuit board 11. Such an external connector 15 is provided to protrude from a mounting surface (upper surface) of the circuit board 11 to the outside of the main body case 4.

In the power conversion device 1 of the present embodiment, a control circuit arrangement area R1 is provided at a center position of the mounting surface (a surface opposite to the power module 10) of the circuit board 11. The control circuit 12 is disposed in this control circuit arrangement area R1. In addition, two drive circuit arrangement areas R2 are provided on the mounting surface in the power conversion device 1 of the present embodiment. The same number of drive circuits 13 are disposed in each of the drive circuit arrangement areas R2. As shown in FIG. 2B, these two drive circuit arrangement areas R2 are disposed on the mounting surface described above with the control circuit arrangement area R1 interposed from both sides. That is, the circuit board 11 has the control circuit arrangement area R1 in which the control circuit 12 is disposed and the drive circuit arrangement area R2 in which the drive circuit 13 is disposed, and two drive circuit arrangement areas R2 are provided with the control circuit arrangement area R1 interposed therebetween in the present embodiment.

In addition, two current sensor circuit arrangement areas R3 (current detection circuit arrangement areas) are provided on the mounting surface of the circuit board 11. A current sensor circuit 14 is disposed in each of the current sensor circuit arrangement areas R3. As shown in FIG. 2B, the current sensor circuit arrangement areas R3 are disposed outside the drive circuit arrangement area R2 on the mounting surface when viewed from the control circuit arrangement area R1. That is, the drive circuit arrangement area R2 is disposed between the control circuit arrangement area R1 and the current sensor circuit arrangement area R3. As described above, the circuit board 11 has the current sensor circuit arrangement area R3 in which the current sensor circuit 14 for detecting an input or output current to or from the power module 10 is disposed outside the drive circuit arrangement area R2 when viewed from the control circuit arrangement area R1 in the present embodiment. In addition, the current sensor circuit arrangement area R3 is provided outside each of the drive circuit arrangement areas R2 in the present embodiment.

The power conversion device 1 of the present embodiment as described above includes a power module 10 having a plurality of power devices, and a circuit board 11 connected to the power module 10. Furthermore, in the power conversion device 1 of the present embodiment, the circuit board 11 has a drive circuit arrangement area R2 in which a plurality of drive circuits 13 that drive the power devices are arranged and a control circuit arrangement area R1 in which the control circuit 12 for controlling the drive circuit 13 is disposed, and two drive circuit arrangement areas R2 are provided with the control circuit arrangement area R1 interposed therebetween.

According to the power conversion device 1 of the present embodiment as described above, two drive circuit arrangement areas R2 are provided on the circuit board 11 to have the control circuit arrangement area R1 interposed between both sides. For this reason, as compared to a case in which the drive circuits 13 are irregularly disposed on the circuit board 11 or a case in which the plurality of drive circuits 13 are collectively disposed in one area, wiring lengths from the control circuit 12 to each of the drive circuits 13 can be equalized. As a result, communication delay time between the control circuit 12 and each of the drive circuits 13 is equalized, and management of communication delays between the control circuit 12 and each of the drive circuits 13 is facilitated. According to the power conversion device 1 of the present embodiment, the control circuit 12 and the drive circuits 13 are mounted on a single board. For this reason, the power conversion device 1 can be made small in size. Furthermore, wiring lengths from the control circuit 12 to the drive circuits 13 are equalized. Therefore, the management of the communication delays between the control circuit 12 and the drive circuits 13 is facilitated.

In addition, in the power conversion device 1 of the present embodiment, the circuit board 11 has the current sensor circuit arrangement area R3 in which the current sensor circuit 14 that detects the input or output current to or from the power module 10 is disposed outside the drive circuit arrangement area R2 when viewed from the control circuit arrangement area R1. In the power conversion device 1 of the present embodiment as described above, the current sensor circuit 14 is provided outside the control circuit 12, and the current sensor circuit 14 is disposed outside the drive circuit 13 when viewed from the control circuit 12. For this reason, the control circuit 12 and the drive circuits 13 can be connected at a shorter distance. Note that the current sensor has a core held in the power module case and a Hall element mounted on the circuit board 11 in the power conversion device 1 of the present embodiment. For this reason, a distance from the current sensor to the current sensor circuit 14, and a distance from the current sensor to the control circuit 12 can be shortened; therefore, the signal transmission between the current sensor and the control circuit 12 can be sped up. Therefore, it is possible to cause the power conversion device 1 to operate more stably.

Moreover, the current sensor circuit arrangement area R3 is provided outside each of the drive circuit arrangement areas R2 in the power conversion device 1 of the present embodiment. According to the power conversion device 1 of the present embodiment as described above, it is possible to dispose the current sensor circuit 14 in a distributed manner, and to dispose a plurality of current sensors in a distributed manner in the power module 10.

Second Embodiment

Next, a second embodiment of the present invention will be described with reference to FIG. 3A and FIG. 3B. Note that description of the same portions as those in the first embodiment will be omitted or simplified in the present embodiment. FIG. 3A is a schematic diagram of the circuit board 11 included in a power conversion device of the present embodiment, and is a schematic diagram which shows a layout of functional constituents included in the circuit board. FIG. 3B is a schematic diagram of the circuit board 11 included in the power conversion device of the present embodiment, and is a schematic diagram in which only an arrangement area shown in FIG. 3A is extracted.

As shown in FIG. 3A and FIG. 3B, the circuit board 11 in the present embodiment includes a discharge circuit 16 and a voltage sensor circuit 17 (voltage detection circuit). The discharge circuit 16 is a circuit that discharges (discharges power) electric charges stored in a capacitor 3 (smoothing capacitor) included in the power conversion device 1. The discharge circuit 16 is a high voltage circuit that handles a higher voltage than the control circuit 12, and discharges power from the capacitor 3 under the control of the control circuit 12.

The voltage sensor circuit 17 is a circuit for detecting the input voltage to the discharge circuit 16 and the power module 10. The voltage sensor circuit 17 is connected to the voltage sensor mounted on the circuit board 11 via, for example, a terminal section 18 for voltage detection held in the power module case. This voltage sensor circuit 17 generates a signal indicating a value of a voltage input to the control circuit 12 based on a signal input from the voltage sensor. This voltage sensor circuit 17 is connected to the control circuit 12.

In the present embodiment, a discharge circuit arrangement area R4 is provided on the circuit board 11. The discharge circuit 16 is disposed in the discharge circuit arrangement area R4. This discharge circuit arrangement area R4 is disposed in a direction orthogonal to a disposition direction of the control circuit arrangement area R1 and two drive circuit arrangement areas R2 for the control circuit arrangement area R1 as shown in FIG. 3B. That is, as shown in FIG. 3B, the discharge circuit arrangement area R4 is disposed in a direction orthogonal to the disposition direction of the control circuit arrangement area R1 and two drive circuit arrangement areas R2 for the control circuit arrangement area R1. The external connector 15 is disposed on a side opposite to the discharge circuit arrangement area R4 when viewed from the control circuit arrangement area R1.

In the present embodiment as described above, the drive circuit arrangement area R2 and the discharge circuit arrangement area R4 that handle a high voltage are disposed in a state of being adjacent to each other via an area on a right side of the circuit board 11 of FIGS. 3A and 3B without having an area handling a low voltage interposed therebetween. In addition, the control circuit arrangement area R1 and the current sensor circuit arrangement area R3 that handle a low voltage are disposed in a state of being adjacent to each other via an area on a left side of the circuit board 11 of FIGS. 3A and 3B without having an area handling a high voltage interposed therebetween. That is, areas handling a high voltage are disposed to be adjacent to each other, and areas handling a low voltage are disposed to be adjacent to each other in the present embodiment. For this reason, according to the power conversion device of the present embodiment, it is possible to equalize wiring lengths from the control circuit 12 to each of the drive circuits 13 as described above, and to perform a layout in a state in which areas handling a high voltage are integrated and areas handling a low voltage are integrated, respectively.

As in the present embodiment described above, the discharge circuit 16 that is not required to have a high level of responsiveness to an instruction of the control circuit 12 can be disposed apart from the drive circuit 13. As in the present embodiment described above, a circuit that handles a high voltage can be installed in an area different from the drive circuit arrangement area R2. The circuit can be disposed apart from the drive circuit 13. In this manner, a circuit handling a high voltage can be installed in an area different from the drive circuit arrangement area R2 as described in the present embodiment. As a result, a large number of functions can be integrated in one circuit board 11, and the power conversion device 1 can be made more multifunctional and smaller.

In addition, as shown in FIGS. 3A and 3B, the discharge circuit 16 and the voltage sensor circuit 17 are connected via the terminal section 18 for voltage detection, and thereby it is possible to curb heat generated when the discharge circuit 16 is activated from being transmitted to the voltage sensor circuit 17 and the control circuit 12, and to curb the heat generated when the discharge circuit 16 is activated from affecting the voltage sensor circuit 17 and the control circuit 12.

Moreover, in the present embodiment, the external connector 15 and the discharge circuit arrangement area R4 are disposed at opposite positions with the control circuit arrangement area R1 interposed therebetween. For this reason, it is possible to keep the external connector 15 away from an area handling a high voltage, and it is possible to curb an occurrence of noise in communication performed between the outside and the control circuit 12.

As described above, although preferred embodiments of the present invention have been described above with reference to the accompanying drawings, the present invention is not limited to the embodiments described above. The shapes, combinations, and the like of respective constituent members shown in the embodiments described above are examples, and various modifications based on design requirements and the like can be made within a range not departing from the gist of the present invention.

For example, in the embodiments described above, a configuration in which two current sensor circuit arrangement areas R3 are provided on the circuit board 11 has been described. However, the present invention is not limited thereto. It is possible to adopt a configuration in which the current sensor circuit arrangement area R3 is not provided or a configuration in which only one current sensor circuit arrangement area R3 is provided.

In addition, a configuration in which a high voltage circuit arrangement area is set as the discharge circuit arrangement area R4 in which the discharge circuit 16 is installed has been described in the second embodiment described above. However, the present invention is not limited thereto, and it is possible to adopt a configuration in which another circuit handling a high voltage is disposed in the high voltage circuit arrangement area.

Moreover, a configuration in which four drive circuits 13 are disposed in one drive circuit arrangement area R2 has been described in the embodiment. However, the present invention is not limited thereto. For example, it is possible to adopt a configuration in which seven drive circuits 13 are installed or three drive circuits 13 are installed in one drive circuit arrangement area R2.

According to the present invention, in the power conversion device, it is possible to decrease the power conversion device in size because the control circuit and the drive circuits are mounted on a single board, and the management of communication delays between the control circuit and the drive circuits can be facilitated because the wiring lengths from the control circuit to the drive circuits are equalized.

EXPLANATION OF REFERENCES

1 Power conversion device
2 Intelligent power module
3 Capacitor (Smoothing capacitor)
4 Main body case
10 Power module
11 Circuit board
12 Control circuit
13 Drive circuit
14 Current sensor circuit (current detection circuit)
15 External connector (external interface)
16 Discharge circuit (high voltage circuit)
17 Voltage sensor circuit (voltage detection circuit)
18 Terminal section
R1 Control circuit arrangement area
R2 Drive circuit arrangement area
R3 Current sensor circuit arrangement area (current detection circuit arrangement area)
R4 Discharge circuit arrangement area (high voltage circuit arrangement area)

What is claimed is:
1. A power conversion device comprising:
a power module that has a plurality of power devices; and
a circuit board that is connected to the power module,
wherein the circuit board has a drive circuit arrangement area in which a plurality of drive circuits for driving the plurality of power devices are disposed and a control circuit arrangement area in which a control circuit for controlling the drive circuit is disposed,
two drive circuit arrangement areas are provided with the control circuit arrangement area interposed therebetween,
the circuit board has a current detection circuit arrangement area in which a current detection circuit for detecting an input or output current to or from the power module is disposed outside the drive circuit arrangement area when viewed from the control circuit arrangement area, the current detection circuit arrangement area is provided outside each of the drive circuit arrangement areas, and the current detection circuit is connected to the control circuit to avoid the drive circuit arrangement areas.

2. The power conversion device according to claim 1, wherein:

the circuit board has a high voltage circuit arrangement area in which a high voltage circuit handling a higher voltage than the control circuit; and the high voltage circuit arrangement area is disposed in a direction orthogonal to an arrangement direction of the control circuit arrangement area and two of the drive circuit arrangement areas for the control circuit arrangement area.

3. The power conversion device according to claim 2, further comprising:

a smoothing capacitor, wherein the high voltage circuit is a discharge circuit that discharges electric charges stored in the smoothing capacitor, and the circuit board includes a voltage detection circuit that detects an input voltage to the high voltage circuit and is connected to the control circuit.

4. The power conversion device according to claim 3, wherein:

the high voltage circuit arrangement area is disposed in a direction orthogonal to an arrangement direction of the control circuit arrangement area and two of the drive circuit arrangement areas for the control circuit arrangement area; and the circuit board is disposed on a side opposite to the high voltage circuit arrangement area when viewed from the control circuit arrangement area and includes an external interface that connects the control circuit and the outside.

5. The power conversion device according to claim 4, wherein:

the external interface and the high voltage circuit arrangement area are disposed at opposite positions with the control circuit arrangement area interposed therebetween.

6. The power conversion device according to claim 3, wherein:

the discharge circuit and the voltage detection circuit are connected via the terminal section for voltage detection which is held in the power module case.

7. The power conversion device according to claim 2, wherein:

the high voltage circuit arrangement area is disposed in a direction orthogonal to an arrangement direction of the control circuit arrangement area and two of the drive circuit arrangement areas for the control circuit arrangement area; and the circuit board is disposed on a side opposite to the high voltage circuit arrangement area when viewed from the control circuit arrangement area and includes an external interface that connects the control circuit and the outside.

8. The power conversion device according to claim 7, wherein:

the external interface and the high voltage circuit arrangement area are disposed at opposite positions with the control circuit arrangement area interposed therebetween.

* * * * *